United States Patent
Yoshimuta

(10) Patent No.: US 10,684,446 B2
(45) Date of Patent: Jun. 16, 2020

(54) FREQUENCY CONTROL APPARATUS, MOTOR DRIVING APPARATUS, AND OPTICAL APPARATUS

(71) Applicant: CANON KABUSHIKI KAISHA, Tokyo (JP)

(72) Inventor: Junki Yoshimuta, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 252 days.

(21) Appl. No.: 15/361,579

(22) Filed: Nov. 28, 2016

(65) Prior Publication Data
US 2017/0168257 A1 Jun. 15, 2017

(30) Foreign Application Priority Data
Dec. 10, 2015 (JP) .................. 2015-240719

(51) Int. Cl.
| | |
|---|---|
| G02B 7/08 | (2006.01) |
| G02B 7/10 | (2006.01) |
| G02B 7/14 | (2006.01) |
| H02N 2/06 | (2006.01) |
| H03L 7/00 | (2006.01) |

(52) U.S. Cl.
CPC .............. G02B 7/08 (2013.01); G02B 7/102 (2013.01); G02B 7/14 (2013.01); H02N 2/062 (2013.01); H03L 7/00 (2013.01)

(58) Field of Classification Search
CPC . G02B 7/08; G02B 7/14; H02N 2/062; H03L 7/00

USPC .................................................. 359/820, 824
See application file for complete search history.

(56) References Cited

U.S. PATENT DOCUMENTS

| | | | |
|---|---|---|---|
| 7,317,291 B2 | 1/2008 | Atsuta et al. | |
| 8,311,623 B2* | 11/2012 | Sanger | A61B 5/0488 600/546 |
| 2002/0131533 A1* | 9/2002 | Koizumi | H04L 27/3809 375/345 |
| 2005/0039219 A1* | 2/2005 | Cooper | G10L 21/04 725/134 |
| 2016/0182271 A1* | 6/2016 | Chance | H04L 27/2672 375/344 |

FOREIGN PATENT DOCUMENTS

JP          4838567 B2      12/2011

* cited by examiner

*Primary Examiner* — James R Greece
(74) *Attorney, Agent, or Firm* — Rossi, Kimms & McDowell LLP

(57) ABSTRACT

A frequency control apparatus includes a signal generator configured to generate an output signal as a digital signal having a target frequency that has been set, using a plurality of signals having frequencies that are different from the target frequency and one another, an estimator configured to estimate a mixed frequency that is a frequency of a signal component mixed in the output signal and different from the target frequency and each of frequencies of the plurality of signals, and a frequency shift unit configured to shift at least one of the target frequency and the frequencies of the plurality of signals in accordance with an estimation result of the mixed frequency.

8 Claims, 10 Drawing Sheets

FREQUENCY CONTROL APPARATUS, MOTOR DRIVING APPARATUS, AND OPTICAL APPARATUS

BACKGROUND OF THE INVENTION

Field of the Invention

The present invention relates to a frequency control apparatus using a PDM system and a motor driving apparatus configured to drive a vibration motor using the same.

Description of the Related Art

One of the pulse modulation systems is a Pulse Frequency Modulation (PFM) system configured to modulate a frequency of a carrier period. The PFM system is classified into a system configured to steplessly change a frequency, and a system configured to simulatively change a frequency by thinning out a frequency clock to be used. The illustrative former system is a Voltage Controlled Oscillator (VCO) system that can obtain a comparatively fine frequency resolution for an input voltage. The illustrative latter system is a Pulse Density Modulation (PDM) system that increases the frequency resolution by changing an average frequency per a unit time period while maintaining constant the input clock. The PDM system that can be implemented by a digital circuit is economically more advantageous than the VCO system that can be implemented by an analogue circuit.

Since the PDM system obtains a high frequency resolution by changing the frequency for each predetermined time period and by averaging the result along the time axis, the output frequency does not become constant and scatters when it is observed at predetermined time intervals. Therefore, in controlling the driving system to which an output signal generated by the PDM method (PDM control) is input, the frequency scattering in the PDM control causes an uneven speed profile for the driving system and a signal in an audible band.

Japanese Patent No. 4838567 discloses a motor driving apparatus that makes high a resolution of the driving frequency applied to the vibration motor by the PDM control using an adder, and controls a motor by adding random noises to the frequency scattering by the PDM control using the adder. The motor control apparatus adds the random noises, disperses the frequency, and reduces a frequency component having a high spectrum for a specific setting oscillatory frequency and thereby a peaky frequency spectrum in the audible band.

However, the motor driving apparatus disclosed in Japanese Patent No. 4838567 simply disperses the spectrum intensity by adding the random noises to the periodical frequency component different from the driving frequency. This motor driving apparatus can disperse the frequency spectrum intensity and prevent the frequency component having a high spectrum intensity in the audible band, but the signal in the audible band itself remains. Hence, the signal in the audible band (noise) may be amplified by the resonance in the motor installed apparatus, etc. In addition, the frequency scattering may increase at predetermined time intervals due to the random noises, and the uneven speed of the driving system may increase.

SUMMARY OF THE INVENTION

The present invention provides a frequency control apparatus and a motor driving apparatus having the same, etc. which can control a frequency by a PDM system so as to prevent an unnecessary frequency component from being contained in a specific band.

A frequency control apparatus according to the present invention includes a signal generator configured to generate an output signal as a digital signal having a target frequency that has been set, using a plurality of signals having frequencies that are different from the target frequency and one another, an estimator configured to estimate a mixed frequency that is a frequency of a signal component mixed in the output signal and different from the target frequency and each of frequencies of the plurality of signals; and a frequency shift unit configured to shift at least one of the target frequency and the frequencies of the plurality of signals in accordance with an estimation result of the mixed frequency.

Further features of the present invention will become apparent from the following description of exemplary embodiments with reference to the attached drawings.

DESCRIPTION OF THE EMBODIMENTS

A description will now be given of embodiments of the present invention with reference to the accompanying drawings.

First Embodiment

Figure 1:
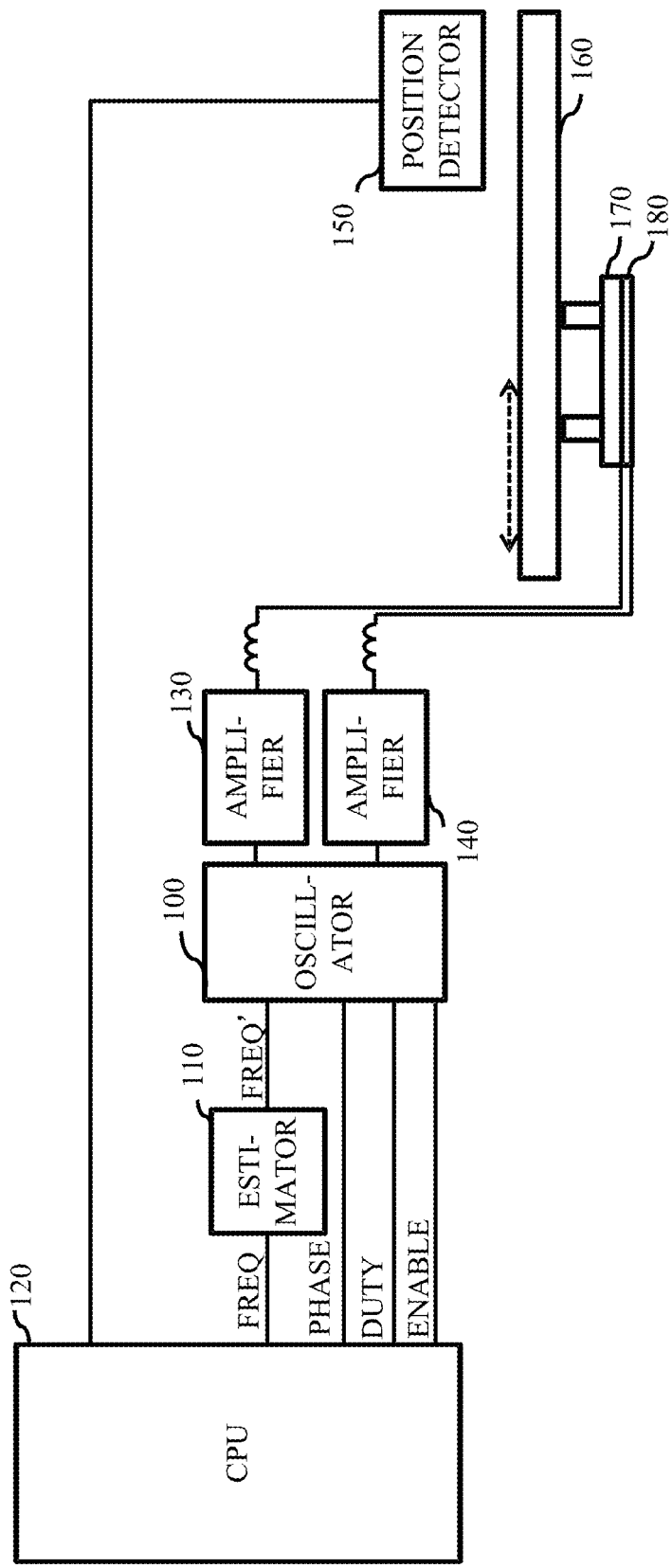
FIG. 1 is a block diagram illustrating a configuration of a vibration motor driving apparatus according to a first embodiment of the present invention.

FIG. 1 illustrates a configuration of a vibration motor driving apparatus that includes a frequency control apparatus according to a first embodiment of the present invention. In FIG. 1, the vibration motor includes an oscillating object 170, a piezoelectric element 180 as an electrical-mechanical energy conversion element, and a mover 160 as a contact member. The vibration motor driving apparatus includes a microcomputer (referred to as a "CPU" hereinafter) 120, an A-mode amplifier 130, a B-mode amplifier 140, an oscillator 100, an estimator (frequency shift unit) 110, and a position detector 150. The CPU 120, the oscillator 100, and the estimator 110 constitute a frequency control apparatus. The CPU 120 and the oscillator 100 constitute a signal generator, and the estimator 110 constitutes an estimator and the frequency shift unit. The CPU 120, the oscillator 100, and the estimator 110 are comprised by a single computer or separate computers.

In the vibration motor, the piezoelectric element 180 to which a two-phase frequency signal (driving signal) having mutually phase differences is applied produces a harmonic vibration. The oscillating object 170 is an elastic member coupled with the piezoelectric element 180, and the vibration of the piezoelectric element 180 excites two oscillation modes (A mode and B mode) of bending vibrations. The A mode is a secondary bending vibration mode in a long side direction of the oscillating object 170, and the B mode is a primary bending vibration mode in a short side direction of the oscillating object 170. A temporal phase difference between the A and B modes of vibrations can create an elliptical motion on a surface of the oscillating object 170. The mover 160 compressively contacts the oscillating object 170, and moves relative to the oscillating object 170 due to the friction with the oscillating object 170. Thus, the oscillating object 170 and the mover 160 move relative to each other.

The CPU 120 governs controls over the entire vibration motor driving apparatus. The CPU 120 outputs a signal indicative of a setting oscillatory frequency (target frequency) FREQ as an oscillatory frequency set (designated) from the outside as a frequency of the output pulse. This setting oscillatory frequency FREQ is output to the oscillator 100 as the setting oscillatory frequency FREQ' via a frequency shift process, which will be described later, at the estimator 110. The CPU 120 outputs, to the oscillator 100, a signal indicative of a set phase difference PHASE set from the outside as a phase difference between the A and B modes. The CPU 120 outputs, to the oscillator 100, a signal indicative of a pulse duty ratio DUTY set from the outside as a pulse duty ratio, and a signal indicative of an output enablement ENABLE of the oscillator 100. The oscillator 100 performs an oscillation operation for generating an output signal used to drive the vibration motor in the A and B modes in accordance with FREQ', PHASE, DUTY, and ENABLE.

The oscillator 100 includes a counter of a predetermined bit number (30 bits in this embodiment, and $CNT_{max}=2^{30}-1$ where $CNT_{max}$ is the maximum count value), and a comparator configured to determine whether the current count value is equal to or higher than a threshold count value.

The A-mode amplifier 130 amplifies an A-mode driving signal, and applies it to the vibration motor via an inductor. The B-mode amplifier 140 amplifies a B-mode driving signal, and similarly applies it to the vibration motor via an inductor.

The position detector 150 detects a moving amount or position of the mover 160, and outputs the detection result to the CPU 120. The CPU 120 controls driving of the vibration using position information obtained from the position detector 150 and speed information calculated from the position information.

The present invention is not limited to this embodiment that supplies a two-phase driving signal to the oscillating object 170 that oscillates in the two driving modes.

Next follows a description of a principle of a signal generation (referred to as a "PDM control of an adder system" or simply "PDM control" hereinafter), with reference to FIG. 2. The driving signal contains a signal component of a modulated frequency as a mixed frequency different from a driving frequency that is a frequency of the driving signal or a "modulated frequency is generated." A cause will be described below. This embodiment performs a frequency shift process configured to change or shift a setting oscillatory frequency so as to avoid the modulated frequency from occurring in the prohibited frequency band as the specific frequency band by the PDM control with the setting oscillatory frequency FREQ. The frequency shift process will be described later in detail, and the setting oscillatory frequency that has received the frequency shift process will be referred to as a post-shift setting oscillatory frequency hereinafter.

Figure 2:
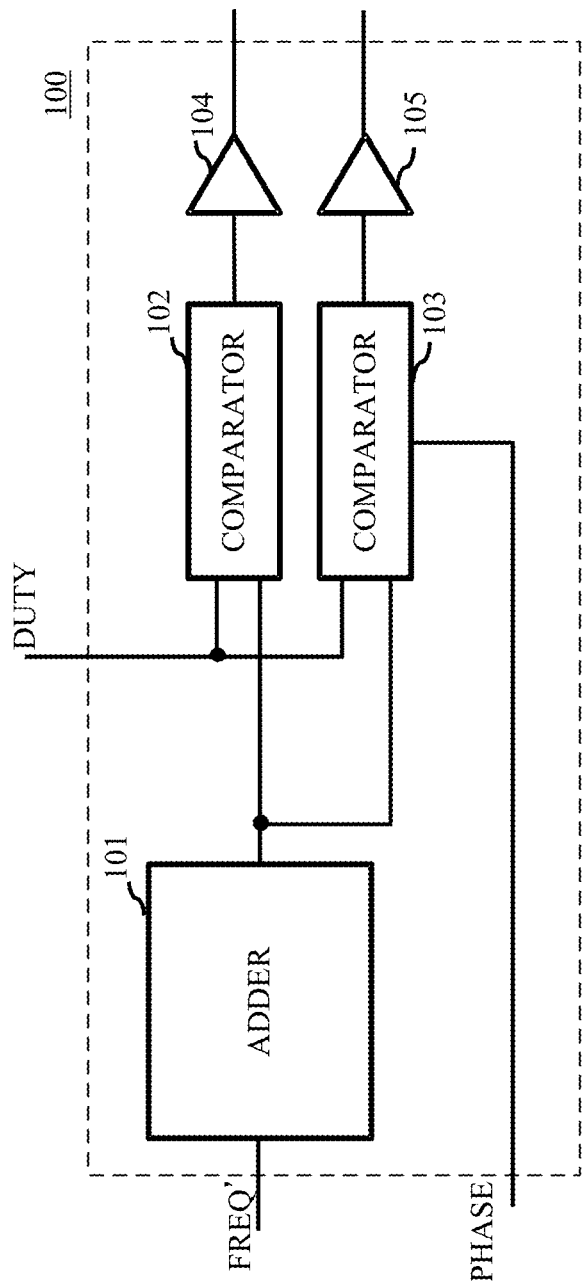
FIG. 2 is a block diagram illustrating a configuration of an oscillator for a PDM control with an adder system according to the first embodiment.

FIG. 2 illustrates a configuration of the oscillator 100. The oscillator 100 includes an adder 101, an A-mode comparator 102, a B-mode comparator 103, an A-mode amplifier 104, and a B-mode amplifier 105.

The adder 101 includes a counter, and adds the following added value at a clock period with the post-shift setting oscillatory frequency FREQ'.

The A-mode comparator 102 compares the count value from the adder 101 with the compared value set by DUTY, and generates an output signal (referred to as a "A-mode output pulse" hereinafter) as a pulsed digital signal in accordance with the comparison result. The A-mode comparator 102 can set a pulse width or a leading edge timing of the output signal in accordance with the set value of DUTY set from the outside.

The B-mode comparator 103 compares the count value from the adder 101 with the compared value set by DUTY and PHASE, and generates an output signal (referred to as a "B-mode output pulse" hereinafter) as a pulsed digital signal in accordance with the comparison result. Similar to the A-mode comparator 102, the B-mode comparator 103 can set the pulse width (leading edge timing of the output signal) in accordance with the set value of DUTY set from the outside. PHASE sets a count value with which the B-mode output pulse becomes high or low relative to the A-mode output pulse for the B-mode comparator 103.

The A-mode amplifier 104 amplifies and outputs the A-mode output pulse from the A-mode comparator 102, and the B-mode amplifier 105 amplifies and outputs the B-mode output pulse from the B-mode comparator 103.

Next follows a description of a cause of the frequency scattering in a predetermined period of a pulse output in the PDM control of the adder system.

Figure 3:
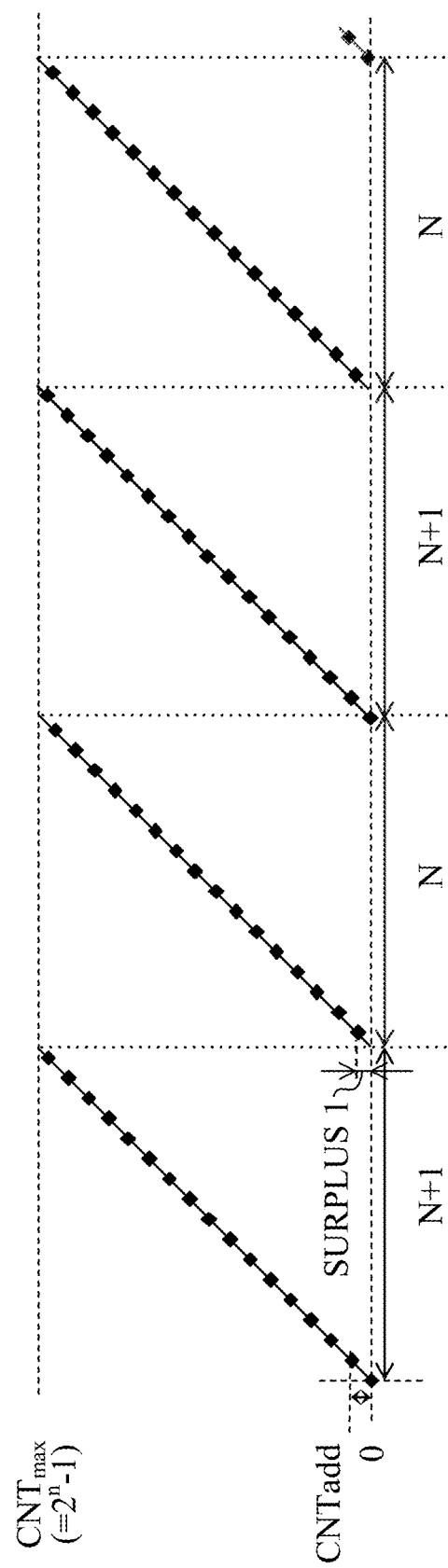
FIG. 3 is a view for explaining a change of a counted value by a counter in a PDM control according to the first embodiment.

FIG. 3 is a graph in which each block dot presents a locus of a count value when the counter adds a certain added value for each set clock period. In FIG. 3, the ordinate axis denotes a count value of the adder 101, and the abscissa axis denotes time. The added value $CNT_{add}$ can be calculated as follows using the post-shift setting oscillatory frequency FREQ'[Hz] input to the adder 101, a clock frequency CLK [Hz], and a count upper limit value $CNT_{max}$:

$$CNT_{add}=FREQ'\times(CNT_{max}+1)/CLK.$$

When the added values $CNT_{add}$ is repetitively added for each clock period from the count lower limit value, the counter will be sometime overflown or the count value exceeds the count upper limit value. At this time, the count value returns to 0, and the added value $CNT_{add}$ is added to the surplus value at the overflow for each clock period. When $CNT_{add}$ is constant, the count value draws a triangular wave (sawtooth) locus having a constant slope with a temporal change, as illustrated in FIG. 3.

Where a count period is defined as a time period for the count value to change from the count lower limit value to the count upper limit value (actually a value close to the count upper limit value), an initial value (surplus value at the overflow) is different for each count period when the overflow occurs. When the initial value is smaller than a certain value (a change amount of a surplus value in the count period interval), the number of additions of $CNT_{add}$ in the same count period increases by one.

When the number of additions increases by one, the output pulse period becomes longer by 1/CLK [sec]. This is a cause of the frequency scattering in the PDM control of the adder system. Hence, a frequency higher than the post-shift setting oscillatory frequency FREQ' does not occur. In addition, the modulated frequency depends on the magnitude of the surplus value in the overflow of the counter (strictly speaking a change amount of the surplus value in the count period interval). Thus, as the surplus value is larger, the high frequency component is more likely to occur. A maximum value of the modulated frequency becomes the setting oscillatory frequency/2. If the surplus value is 0 or if $(CNT_{max}+1)$ is dividable by $CNT_{add}$, the modulated frequency does not occur.

As illustrated in FIG. 3, in the first count period, $CNT_{add}$ is added totally N+1 times, and the counter is overflown by the (N+2)-th addition. In the second count period, the count accumulation starts with an initial value of an overflow surplus value Surplus1 in the first period, $CNT_{add}$ can be added by N times, and the counter is overflown at the (N+1)-th addition. $CNT_{add}$ is added (N+1) times in the third period and N times in the fourth period due to the count period. The number of additions is different according to the count period. The PDM control is characterized in that the number of additions is different due to the period. The modulated frequency may overlap an audible band for the user and/or the resonance band for the driving system depending on the frequency of the addition number change by the count period, and the negative influence may occur on the control and quality.

For example, when the clock frequency CLK is 40 MHz, the count upper limit $CNT_{max}$ is $2^3$, and the post-shift setting oscillatory frequency FREQ' is 70 kHz, the added value $CNT_{add}$ becomes 1879048.192. When the adder 101 does not deal with a floating point, a decimal is disregarded and $CNT_{add}$ is expressed as 1879048. This value is added to the counter for each clock period, and the value exceeds the count upper limit value $CNT_{max}$ at the $572^{nd}$ period.

The initial value is set to 1073631 in the next count period, and $CNT_{add}$ is added for each clock period. In the second count period, the value exceeds the count upper limit $CNT_{max}$ at the $571^{st}$ clock period. In the subsequent count period, the value exceeds the count upper limit value $CNT_{max}$ at the $572^{nd}$ clock period, the $571^{nd}$ clock period, the $572^{nd}$ clock period, the $571^{nd}$ clock period, the $572^{nd}$ clock period, the $571^{nd}$ clock period, the $572^{nd}$ clock period, the $571^{nd}$ clock period, . . . .

The frequency (first frequency) corresponding to the $572^{nd}$ clock period is 69.3006993 kHz, and the frequency (second frequency) corresponding to the $571^{nd}$ clock period is 70.0525394 kHz. The oscillator 100 realizes 70 kHz as the post-shift setting oscillatory frequency FREQ' by adjusting the appearance ratio of these two frequencies. In this example, the modulated frequency occurs at about 35 kHz and about 10 kHz. At which clock in which clock period the counter is overflown is found by a recursive and repetitive calculation or by a frequency analysis on the pulse output. However, due to a high calculation cost, the calculation processing apparatus having a moderate calculation capability, such as a microcomputer, has a heavy processing load. Accordingly, this embodiment realize the PDM control that reduces the calculation cost by estimating the modulated frequency, and can prevent the modulated frequency in the predetermined band.

Figure 4:
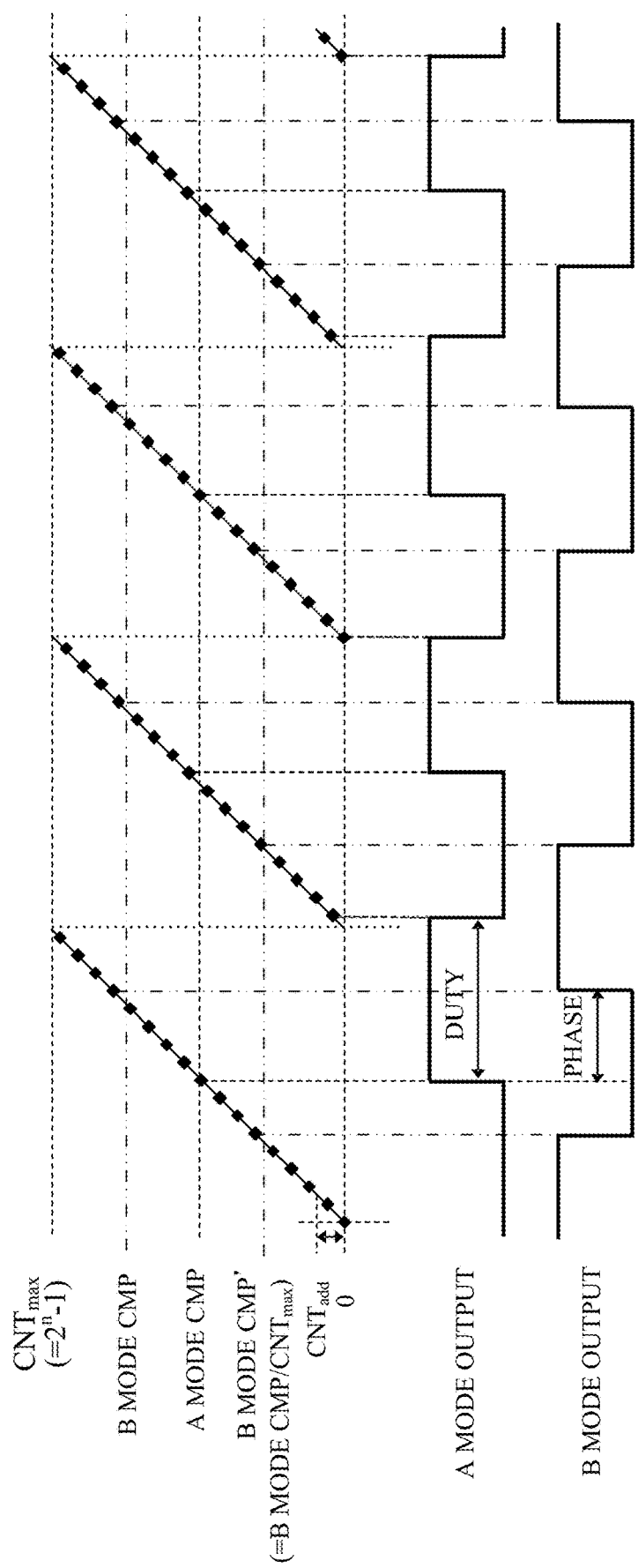
FIG. 4 is a view illustrating a relationship between a behavior of the counter and a pulse output in the PDM control in a vibration motor driving circuit according to the first embodiment.

Referring to FIG. 4, a description will be given of how the oscillator 100 having the configuration illustrated in FIG. 2 provides the two-phase output signal (A-mode output signal and B-mode output signal). Similar to FIG. 3, the top in FIG. 4 illustrates a graph made with a locus of black dots as added values in the counter for each set clock period where the ordinate axis represents a count value of the adder 101 and the abscissa axis represents time. The bottom in FIG. 4 illustrates the A-mode output pulse and the B-mode output pulse in order from the top.

DUTY is represented by 0 to 100% in a high section of a pulsed output, and the value of the count value×(100−DUTY) is set to a compared value (predetermined value) in accordance with the set value, and the A-mode comparator 102 performs comparison matching. The compared value is a value between the count lower limit value and the count upper limit value. At the timing when the count value is larger than the compared value, the A-mode output pulse becomes high, the counter is overflown, and the high state continues till the next count period starts. While the count value is smaller than the compared value in the next count period, the A-mode output pulse is low.

Since DUTY equivalent with that of the A mode is also set to the B mode, the high and low section have basically equal widths, although they are not perfectly equal to each other due to the same cause of the frequency scattering in the PDM control. Moreover, the set value of PHASE causes the phase difference between the B-mode output pulse and the A-mode output pulse to be set. For example, assume that PHASE is 90 degrees. Then, the count period is 360 degrees. The compared value in the B-mode comparator 103 is made by adding $CNT_{max}/4$ to the compared value set in the A-mode comparator 102. The compared value at the leading edge timing for the B-mode comparator 103 is also set.

FIG. 3 illustrates that the modulated frequency is caused by the surplus value that occurs based on the relationship between the count upper limit value and the added value. When the count upper limit value is converted into a compared value set to each of the A mode comparator 102 and B mode comparator 103, a similar phenomenon occurs. This embodiment is applicable to a modulated frequency that occurs due to the duty ratio and phase difference settings.

The vibration motor as a driven object for the vibration motor driving apparatus according to this embodiment is driven with an oscillatory frequency band higher than the human audible band. The modulated frequency occurs in the PDM control as described above only in a frequency band lower than the setting oscillatory frequency.

Based on the above precondition, this embodiment sets the prohibited frequency band (specific frequency band) to 20 Hz to 20 kHz as the human audible band, and estimates one of the plurality of modulated frequencies that occur in the PDM control. This embodiment estimates the modulated frequency (low frequency) lower than at least one of the plurality of modulated frequency.

Herein, the following relationship is established where $Q_1$ is a quotient of $(CNT_{max}+1)/CNT_{add}$, $S_1$ is a surplus (remainder) of $(CNT_{max}+1)/CNT_{add}$, $CNT_{max}$ is the count upper limit value, and the added value $CNT_{add}$ is made by converting the post-shift setting oscillatory frequency added to each other for each clock:

$$(CNT_{max}+1+S_1)/CNT_{add}=Q_2 \ast \ast \ast S_2$$

The clock frequency up to the overflow in the second count period and the initial value in the third count period can be expressed with the quotient $Q_2$ and the surplus $S_2$ in the above expression.

The following estimated modulated frequency $FREQ_{est.1}$ is a value made by converting into a frequency an absolute value of a difference between the surplus $S_1$ in the first count period and the surplus $S_2$ in the second count period:

$$FREQ_{est.1}=|S_1-S_2|\times CLK/(CNT_{max}+1)$$

This embodiment determines whether the modulated frequency $FREQ_{est.1}$ is included in the prohibited frequency band, based on the estimation result.

Figure 5:
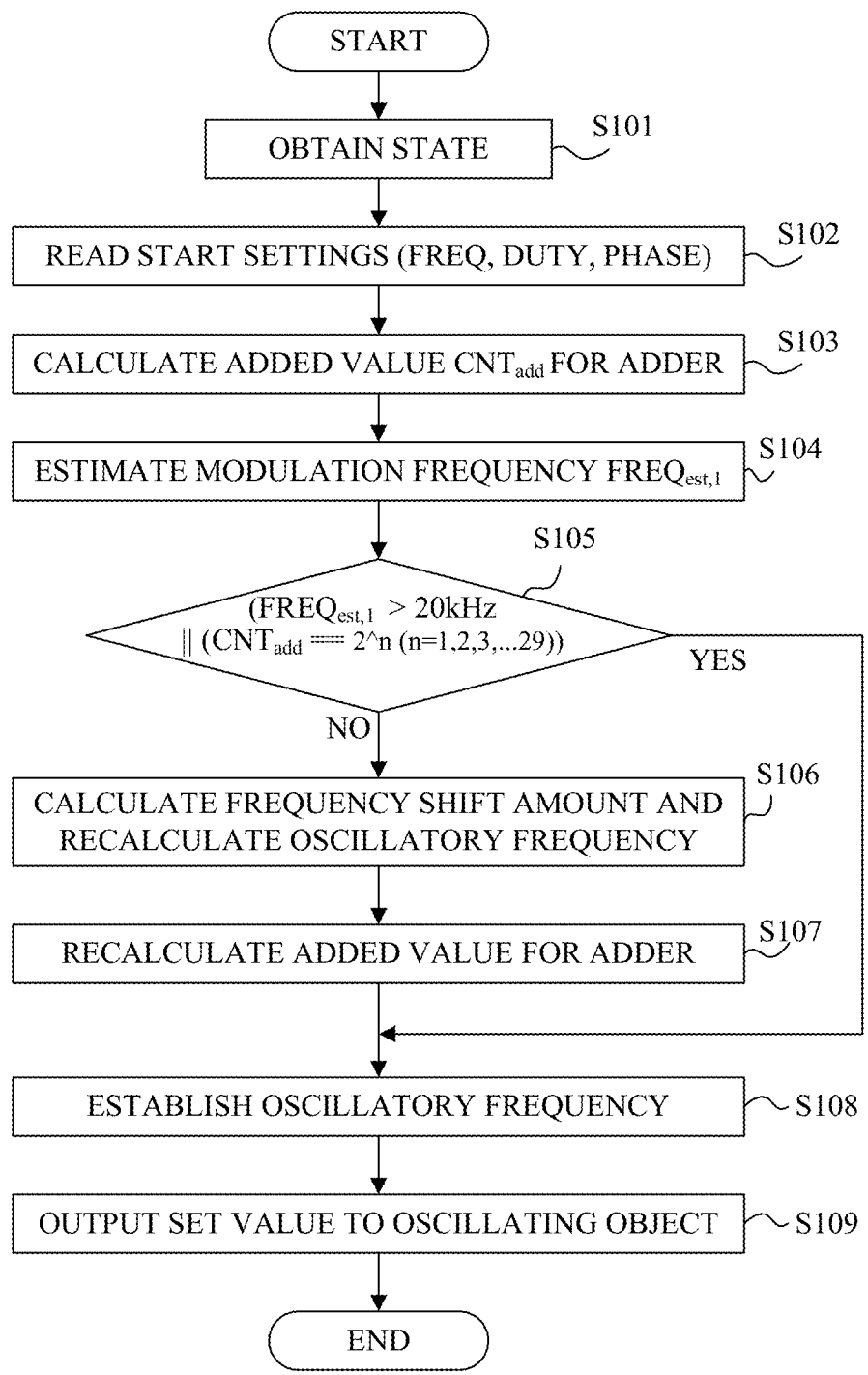
FIG. 5 is a flowchart of a process driven with a constant frequency by the vibration motor driving apparatus according to the first embodiment.

Referring now to the flowchart in FIG. 5, a description will be given of processes performed by the CPU 120 and the estimator 110 when the vibration motor according to this embodiment is driven at a constant frequency. The CPU 120 and the estimator 110 execute these process in accordance with a driving control program as a computer program. The driving control program includes a frequency control program that performs a frequency shift process for the setting oscillatory frequency.

In the step S101, the CPU 120 obtains a state of the vibration motor driving apparatus (referred to as a "motor driving apparatus" hereinafter). The vibration motor is subject to the temperature characteristic of the piezoelectric element and a deterioration caused by the abrasion between the oscillating object and the contact member, and the oscillatory frequency characteristic (such as a start oscillatory frequency when driving starts) in the driving may be changed as the driving environment changes. Hence, the CPU 120 that has received the driving process command obtains temperature information from an unillustrated temperature sensor and the sequentially stored driving number of the vibration motor from an unillustrated memory.

Next, in the step S102, the CPU 120 obtains the setting oscillatory frequency FREQ, the set duty ratio DUTY, and the set phase difference PHASE between A and B modes, from the unillustrated memory, and outputs (sets) only the setting oscillatory frequency FREQ to the estimator 110. The CPU 120 outputs, as the setting oscillatory frequency FREQ, a fine adjusted value of the setting oscillatory frequency stored in the memory in accordance with the temperature information and the driving number information obtained in the step S101.

In the step S103, the CPU 120 calculates the added value $CNT_{add}$ for each clock period for the adder 101 corresponding to the setting oscillatory frequency FREQ set in the step S102. As described above, the added value $CNT_{add}$ can be calculated by the following expression where the counted upper limit value is $CNT_{max}$ and the clock frequency is CLK:

$$CNT_{add}=FREQ\times(CNT_{max}+1)/CLK$$

The estimator 110 rather than the CPU 120 may perform this process.

Next, in the step S104, the estimator 110 estimates the modulated frequency that would occur when the setting oscillatory frequency FREQ is output to the oscillator 100. As described above, the estimated modulated frequency $FREQ_{est.1}$ is estimated by converting the absolute value of the difference into the frequency between the surplus value $S_1$ that occurs in the overflow in the first count period and the surplus value $S_2$ that occurs in the overflow in the second count period or by the calculation of $|S_1-S_2|\times CLK/(CNT_{max}+1)$.

Next, in the step S105, the estimator 110 determines whether the estimated modulated frequency $FREQ_{est.1}$ calculated in the step S104 is located in the prohibited frequency band. The prohibited frequency band is set to 20 Hz to 20 kHz as the human audible band, as described above. When the estimated modulated frequency $FREQ_{est.1}$ is located in the prohibited frequency band, the PDM control with the setting oscillatory frequency FREQ set in the step S102 causes the modulated frequency to fall within the prohibited frequency band and it is thus necessary to shift (change) the oscillatory frequency. Hence, the estimator 110 moves to the step S106. On the other hand, when the $FREQ_{est.1}$ is not located in the prohibited frequency band, the flow moves to the step S108.

In the step S106, the estimator 110 calculates a frequency shift amount $\Delta FREQ$ from the setting oscillatory frequency FREQ so that the estimated modulated frequency is located outside of the prohibited frequency band, and performs a frequency shift process for calculating the post-shift setting oscillatory frequency FREQ'. The post-shift setting oscillatory frequency FREQ' is expressed by $FREQ\pm\Delta FREQ$. The frequency shift amount $\Delta FREQ$ is calculated using the following expression with the estimated modulated frequency $FREQ_{est.1}$ and the highest frequency ($FREQ_{SPC}=20$ kHz) in the prohibited frequency band:

$$\Delta FREQ=(20\text{ kHz}-FREQ_{est.1})/Q_1$$

In this expression, $Q_1$ is the number of additions just before the overflow in the first count period. A sign of $\Delta FREQ$ becomes plus when $S_1-S_2$ becomes a negative value, meaning a shift to the high frequency side. The sign of $\Delta FREQ$ becomes minus when $S_1-S_2$ becomes a positive value, meaning a shift to the low frequency side.

The above process can set the post-shift setting oscillatory frequency FREQ' so as to prevent the modulated frequency from being located in the prohibited frequency band, and to minimize the shift amount from the setting oscillatory frequency FREQ set in the step S102.

The prohibited frequency band on the high frequency side has been hitherto described. When the estimated modulated frequency $FREQ_{est.1}$ is closer to 20 Hz as the low frequency side of the prohibited frequency band, the post-shift setting oscillatory frequency FREQ' may be set to a frequency that does not cause the modulated frequency as described later. The counter in the adder 101 in this embodiment can count up to $2^n$, and the count upper limit value $CNT_{max}$ also has a function of n or $2^n-1$. In other words, the post-shift setting oscillatory frequency FREQ' may have a value such that the added value $CNT_{add}$ can be expressed by a power of two. Hence, the added value is set to a power of two closest to the added value $CNT_{add}$ corresponding to the setting oscillatory frequency FREQ calculated in the step S103, and the value converted into the frequency is the post-shift setting oscillatory frequency FREQ'.

This embodiment allows the modulated frequency of 0 in the modulated frequencies below 20 Hz so as to shorten the calculation time period. The modulated frequency of 0 means that the frequency of the signal output by the PDM control can be singularly realized.

Next, in the step S107, the estimator 110 calculates the added value $CNT_{add}$ for each clock period for the adder 101 corresponding to the post-shift setting oscillatory frequency FREQ' calculated in the step S106. Similar to the step S103, the added value $CNT_{add}$ can be expressed as follows where $CNT_{max}$ is the count upper limit value and CLK is the clock:

$$CNT_{add}=FREQ'\times(CNT_{max}+1)/CLK$$

The CPU 120 rather than the estimator 110 may execute this process. Thereafter, the CPU 120 moves to the step S108.

In the step S108, the CPU 120 settles the post-shift setting oscillatory frequency FREQ' calculated by the estimator 110 in the step S106 as information output to the oscillator 100. When it is determined that the modulated frequency that would occur for the setting oscillatory frequency FREQ in the step S105 is not located in the prohibited frequency band, a relationship of FREQ=FREQ' is established.

Next, in the step S109, the CPU 120 outputs the output enablement ENABLE to the oscillator 100. Moreover, the CPU 120 outputs the set duty ratio DUTY set in the step S102, the set phase difference PHASE between the A and B modes, and the post-shift setting oscillatory frequency FREQ' settled in the step S108 to the oscillator 100.

Due to the above process, the added value $CNT_{add}$ is accumulated in the counter in the adder 101 for each clock period, and the outputs of the two-phase A-mode and B-mode output pulses to the vibration motor change when the count value reaches the predetermined value or higher. Since this embodiment maintains constant the duty ratio and the phase difference between the A and B modes, the modulated frequency may be estimated only once when the driving of the vibration motor starts.

When the vibration motor is again driven, the state of the motor driving apparatus may change and the setting oscillatory frequency different from the previous one may need to be set in the step S102. It is thus necessary to estimate the modulated frequency whenever the driving starts. Since the setting oscillatory frequency is different whenever the motor is driven, the modulated frequency by the PDM control is more frequently calculated, but two surplus calculations are enough for the estimation method according to this embodiment. Even when the oscillatory frequency is to be changed, only one division may be added and the increased calculation time period can be almost ignored.

Thus, a time lag from the driving setting to the actual driving start in the vibration motor can be almost ignored, and the motor can be driven at the driving frequency that can prevent the modulated frequency from entering the prohibited frequency band. This embodiment sets the prohibited frequency band to the audible band, but may set it to the frequency band that cannot be used to control the vibration motor.

Figure 6:
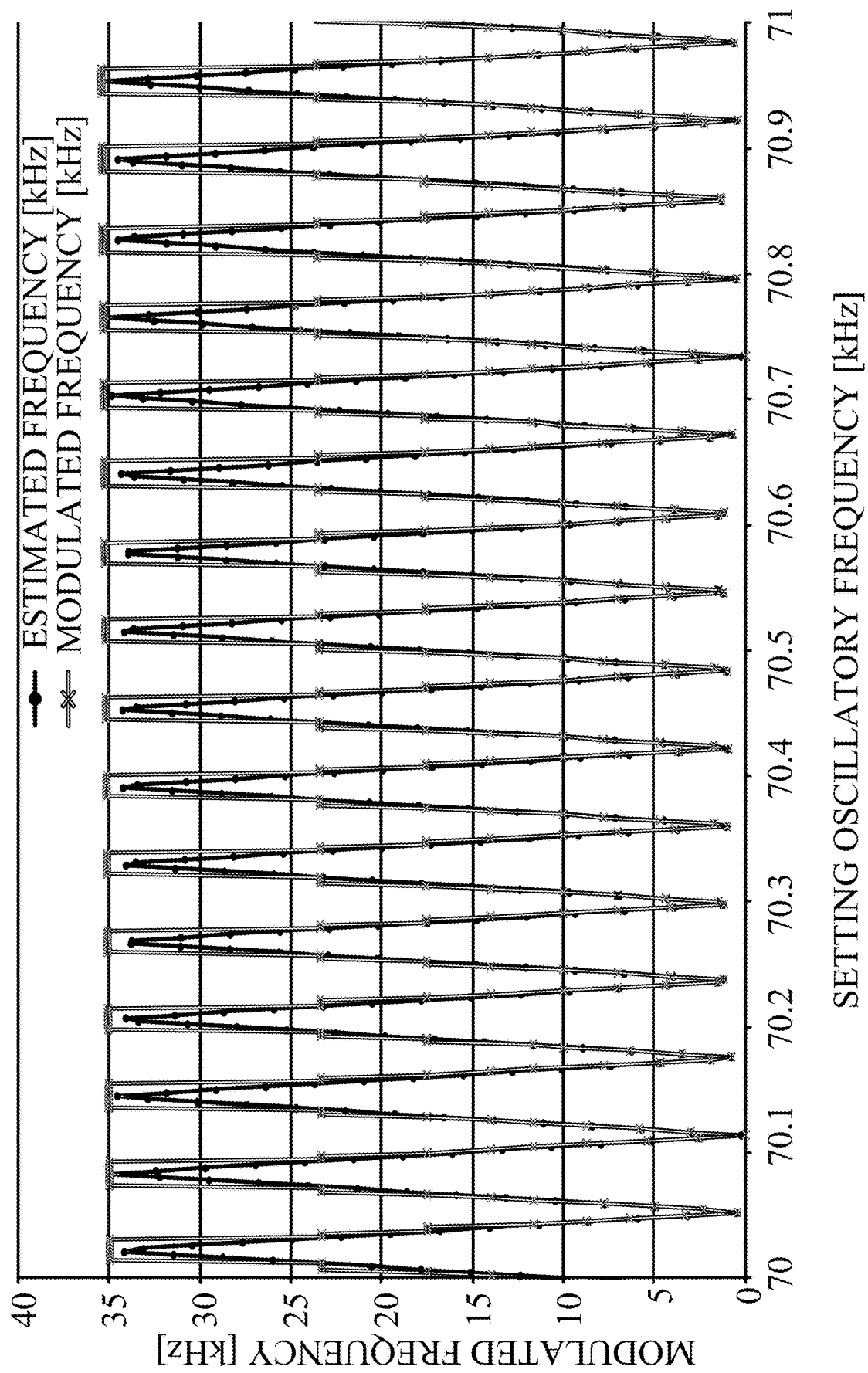
FIG. 6 is a view illustrating a relationship between an actual modulated frequency that occurs for the setting oscillatory frequency, and an estimated modulated frequency.

FIG. 6 illustrates the actual modulated frequency in the PDM control and the estimated modulated frequency. The abscissa axis denotes a setting oscillatory frequency FREQ input to the oscillator 100 and the ordinate axis denotes the modulated frequency. ● and x plots are the estimated modulation frequency ("estimated frequency" in FIG. 6) and the actual modulated frequency ("modulated frequency" in FIG. 6), respectively. Both plots represent changes of the estimated modulation frequency and the actual modulated frequency when the counter added value $CNT_{add}$ or the setting oscillatory frequency FREQ is changed.

FIG. 6 illustrates that the estimated modulated frequency is periodically output as a triangular (sawtooth) wave (where the amplitude depends on the setting oscillatory frequency FREQ). Hence, when the estimated modulated frequency is known to the current setting oscillatory frequency, the frequency shift amount used to shift the estimated modulated frequency to the outside of the prohibited frequency band is uniquely determined. The estimated modulated frequency forms a triangular wave because it is calculated from the absolute value of $S_1-S_2$. When the calculation of the absolute value is omitted, the estimated modulated frequency forms a sawtooth wave. Thus, a sign of the frequency shift amount ΔFREQ can be calculated from the sign of $S_1-S_2$.

When the estimated modulated frequency is close to the harmonic side above about 30 kHz, the estimation error to the actual modulated frequency increases. Since this embodiment sets the prohibited frequency band to the human audible band (up to 20 kHz), the estimated error can be ignored. In the overall range of the setting oscillatory frequency, a relationship of the actual modulation frequency the estimated modulated frequency is established, and thus the estimation of the modulated frequency and the frequency shift process in this embodiment are effective in preventing the modulated frequency from entering the prohibited frequency band.

While this embodiment sets the prohibited frequency band to the human audible band, the prohibited frequency band may be set to the band that contains a resonance frequency of the vibration motor.

While this embodiment shifts the setting oscillatory frequency, at least one of the first frequency (69.3006993 kHz) and the second frequency (70.0525394 kHz) used to generate the setting oscillatory frequency may be shifted. Thereby, the modulated frequency may be avoided in the prohibited frequency band.

This embodiment generates the setting oscillatory frequency using two (a plurality of) signals having the first and second frequencies as the frequencies different from the setting oscillatory frequency (target frequency). When the added value is expressed by $2^n$, the setting oscillatory frequency can be generated using the signal having one frequency. The setting oscillatory frequency may be generated using three or more frequencies different from the setting oscillatory frequency. When the three or more frequencies are used, a controller is provided to adjust appearance ratios of the first frequency and the second frequency and to realize the setting oscillatory frequency. The controller variably controls the calculated added value $CNT_{add}$ added for each clock period.

Second Embodiment

Figure 7:
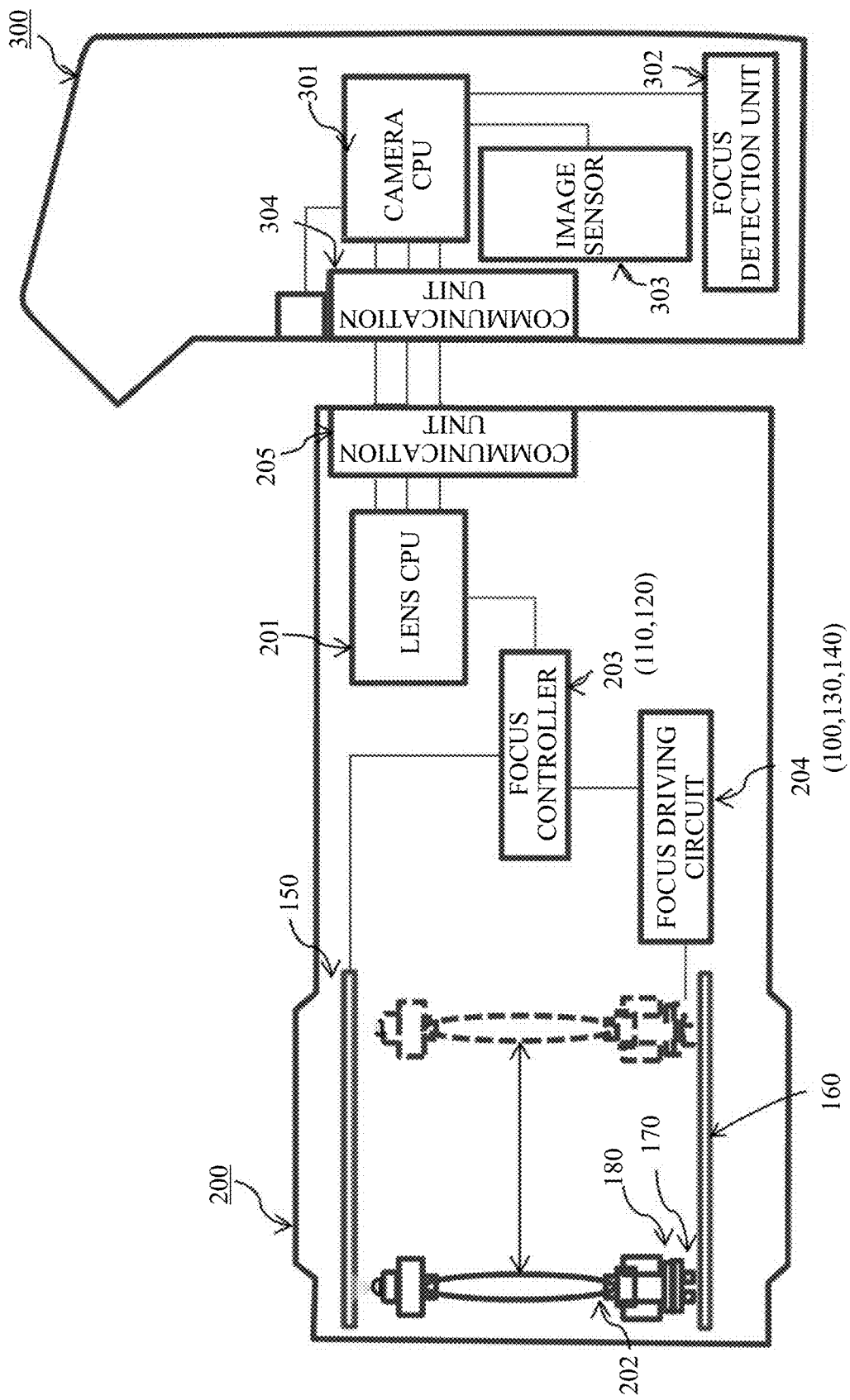
FIG. 7 is a block diagram illustrating a configuration of an AF system in an image capturing apparatus according to a second embodiment according to the present invention.

FIG. 7 illustrates a configuration related to an AF function in a camera system that includes an interchangeable lens 200 as an optical unit including a motor driving apparatus with a frequency control circuit according to the embodiment of the present invention, and a camera body 300 to which the interchangeable lens 200 is detachably attached.

The camera body 300 includes a camera CPU 301, a focus detection unit 302, an image sensor 303, and a camera communication unit 304. The camera CPU 301 controls all operations of the camera body 300. The camera CPU 301 includes a memory, such as a RAM, a ROM, and an EEPROM. The camera CPU 301 determines an in-focus position of the focus lens (optical element) 202 for the object in accordance with a focus detection result in the focus detection unit 302, and sends a focus driving command to the interchangeable lens 200 via the camera communication unit 304.

The focus detection unit 302 detects a focus state of an image capturing optical system for the object using a light flux from the image capturing optical system in the interchangeable lens 200. The focus detection method may be a phase difference detection method, a contrast detection method, or another focus detection method.

The image sensor 303 includes a photoelectric conversion element, such as a CMOS sensor and a CCD sensor. The image capturing optical system in the interchangeable lens 200 forms an image using the light flux from the object, as an object image on the image sensor 303. This embodiment provides focusing by moving the focus lens 202 in the image capturing optical system in the optical axis direction, but may move the image sensor 303 in the optical axis direction using the motor driving apparatus for focusing.

The camera communication unit 304 includes a plurality of communication terminals for communications between the camera CPU 301 and the lens CPU 201, which will be described later, so as to provide a request transmission from the camera CPU 301 to the lens CPU 201 and an information transmission from the lens CPU 201 to the camera CPU 301. The interchangeable lens 200 supplies a power from the unillustrated power unit in the camera body 300 via the camera communication unit 304.

The interchangeable lens 200 includes a lens CPU 201, the image capturing optical system (although only the focus lens 202 is illustrated in FIG. 7), the focus controller 203, the focus driving circuit 204, and the lens communication unit 205. The focus lens 202 is driven by the vibration motor as a driving source (actuator) described in the first embodiment with reference to FIG. 1. The focus controller 203 and the focus driving circuit 204 constitute the motor driving apparatus configured to drive the vibration motor.

The lens CPU 201 controls an operation in the interchangeable lens 200 in accordance with a request from the camera CPU 301 and a state of each component in the interchangeable lens 200. The lens CPU 201 includes a memory, such as a RAM, a ROM, and an EEPROM.

The piezoelectric element 180 and the vibrator 170 illustrated in FIG. 1 are attached to the focus lens 202. When the two-phase driving signal described in the first embodiment is supplied from the focus driving circuit 204 described later to the piezoelectric element 180, the oscillating object 170 elliptically moves. The oscillating object 170 contacts the contact member 160 fixed in the interchangeable lens 200. Thus, the focus lens 202 is driven in the optical axis direction by the friction between the oscillating object 170 and the contact member 160.

The focus controller 203 includes a software and a hardware circuit configured to control an operation relating to the focus lens 202, and includes the CPU 120 and the estimator 110 in the motor driving apparatus illustrated in FIG. 1. The focus controller 203 outputs, to the focus driving circuit 204, a driving command (driving speed, driving amount, and driving direction) of the vibration motor in accordance with the focus driving command from the camera CPU 301 via the lens CPU 201. The focus controller 203 detects the operation of an unillustrated manual focus ring provided onto the interchangeable lens 200 via the lens CPU 201, and outputs the driving command for the vibration motor to the focus driving circuit 204.

The interchangeable lens 200 includes a position detector (referred to as a "focus position detector" hereinafter). This embodiment performs a feedback control over driving of the vibration motor based on a deviation between position information of the focus lens 202 obtained from the focus position detector 150 and a target position set by the focus controller 203. A non-feedback control may be performed for the vibration motor, such as a feed forward control, a closed loop complex control, an open loop control, and a sequence control.

While this embodiment drives the focus lens 202 using the vibration motor, a magnification varying motor (zoom lens) and an aperture stop may be driven by the vibration motor and the motor driving apparatus described in the first embodiment may be used for the vibration motor.

The focus driving circuit 204 drives a vibration motor by converting the driving command from the focus controller 203. The focus driving circuit 204 includes the oscillator 100, the A-mode amplifier 130, and the B-mode amplifier 140 in the motor driving apparatus illustrated in FIGS. 1 and 2.

This embodiment calculates the estimated modulated frequency (first estimated modulated frequency) calculated in the first embodiment and the estimated modulated frequency (second estimated modulated frequency) closer to the low frequency side. In the following description, the actual modulated frequency corresponding to the first estimated modulated frequency will be referred to as a first modulated frequency and the actual modulated frequency corresponding to the second estimated modulated frequency will be referred to as a second modulated frequency.

Where $CNT_{max}$ is the count upper limit value of the adder 101 in the oscillator 100, $CNT_{add}$ is the counter added value determined for the setting oscillatory frequency, $Q_1$ is a quotient, and $S_1$ is a surplus, the following expression is established:

$$(CNT_{max}+1)/CNT_{add}=Q_1 \ast \ast \ast S_1$$

The surplus $S_1$ corresponds to the initial value in the second count period (overflow surplus value in the first count period).

Moreover, the following expression provides the quotient $Q_2$ and the surplus $S_2$:

$$(CNT_{max}+1+S_1)/CNT_{add}=Q_2 \ast \ast \ast S_2$$

The surplus $S_2$ corresponds to the initial value in the third count period (overflow surplus value in the second count period).

The initial value that fluctuates for each count period is expressed using the surpluses $S_1$ and $S_2$. When $FREQ_{est.1}$ is defined as the first estimated modulated frequency as the estimated modulated frequency calculated in the first embodiment, the following expression is established:

$$FREQ_{est.1}=|S_1-S_2|\times CLK/(CNT_{max}+1)$$

The first estimated modulated frequency $FREQ_{est.1}$ can be rewritten as follows using the setting oscillatory frequency FREQ and the counter added value $CNT_{add}$:

$$FREQ_{est.1}=FREQ/(CNT_{add}/|S_1-S_2|)$$

The calculation $(CNT_{add}/|S_1-S_2|)$ in the denominator on the right side provides a count period converted value corresponding to the timing at which the initial value of the count period exceeds $CNT_{add}$. It is the timing of the count period at which the number of additions decreases by one, and the first estimated modulated frequency can be calculated when it is divided by the setting oscillatory frequency FREQ.

Next, the second estimated modulated frequency is calculated. The second estimated modulated frequency can be calculated using a decimal part of α where $CNT_{add}/|S_1-S_2|=α$. Assume that $α_{int}$ is a natural number part of α and $α_{dec}$ is a decimal part of α ($α=α_{int}+α_{dec}$). At the timing when the number of additions is decreased one by the first estimated modulated frequency, the counter may be overflown and the surplus value may occur. It means that a plurality of modulated frequencies exist. When the accumulated surplus values caused by the first modulated frequency exceeds the counter added value $CNT_{add}$, the timing of the count period at which the number of additions decreases one occurs at a timing different from that of the first modulated frequency. This is the second estimated modulated frequency, and the decimal part $\alpha_{dec}$ of $\alpha$ represents the degree of the magnitude of the surplus value.

Since the surplus value accumulated in a period of the first modulated frequency can be calculated as $\mathrm{CNT}_{add} - (|S_1 - S_2| \times \alpha_{dec})$ the second estimated modulated frequency $\mathrm{FREQ}_{est.2}$ can be calculated as follows:

$$\mathrm{FREQ}_{est.2} = \mathrm{FREQ}/(\mathrm{CNT}_{add}/(\mathrm{CNT}_{add} - (|S_1 - S_2| \times \alpha_{dec})))$$

The repetitive recursive calculations using the decimal part of $(\mathrm{CNT}_{add}/(\mathrm{CNT}_{add}(|S_1 - S_2| \times \alpha_{dec})))$ in the above expression can provide all included modulated frequencies.

Assume that the prohibited frequency band is set to the human audible band (20 Hz to 20 kHz), the clock frequency CLK of the oscillator 100 is set to 80 MHz, the count upper limit value $\mathrm{CNT}_{max}$ is set to $2^{30}-1$, and a setting range of the setting oscillatory frequency is 50 to 120 kHz. The probability where the first modulated frequency is located outside of the prohibited frequency band is 50.0%, the probability where the second modulated frequency is located outside of the prohibited frequency band is 11.3%, and the probability where both the first and second modulated frequencies are located outside of the prohibited frequency band is only about 10.9%. Hence, the recursive estimation of the modulated frequency causes a very large shift amount to the outside of the prohibited frequency band, and the driving system of the vibration motor may collapse. When the calculation time associated with the recursive process is considered, it is useless to estimate modulated frequencies more than the second estimated modulated frequency.

Hence, this embodiment provides the estimations up to the second estimated modulated frequency, and sets the prohibited frequency band to 2 to 12 kHz for the first estimated modulated frequency and 3 to 5 kHz for the second estimated modulated frequency. Thereby, under the above assumption, the setting oscillatory frequency that enables both the first modulated frequency and the second modulated frequency to be located outside of the prohibited frequency band increases by about 61% in the overall range of 50 to 120 kHz.

Allegedly, the human audible band ranges from 20 Hz to 20 kHz, but the minimum audible value ranges from 1 to 5 kHz, and a person is generally most sensitive to nearly 4 kHz. Since the sensitivity remarkably deteriorates in the harmonic side above 15 kHz, a limited range of 1 to 15 kHz appears proper when the audible band is redefined according to the sensitivity. Since the sensitivity tends to be high in a low frequency band with a peak of nearly 4 kHz, this embodiment sets the prohibited frequency band near the low frequency. In other words, this embodiment sets the prohibited frequency band so that both the first and second estimated modulated frequencies are not equal to about 4 kHz and the frequency band above 60% of the overall range can be used.

Since the entire audible band is not set to the prohibited frequency band, the frequency in the audible band may occur depending on the setting oscillatory frequency. However, this embodiment can prevent the modulated frequency from being audible to a human using the prohibited frequency band. The prohibited frequency band may be properly set by an application, a condition, and an observer (user), and values in this embodiment are merely illustrative.

The vibration motor in this embodiment is a driving source (actuator) used to drive the focus lens 202, and driven according to the focus driving command from the camera 300 and the operation of the user, as described above. The driving command (driving speed, driving amount and driving direction) is different according to the state of the interchangeable lens 200 and the object, and the variable control is necessary for the driving speed of the vibration motor.

This embodiment makes constant the oscillatory frequency in the focus driving circuit 204 (oscillator 100) in low speed driving, changes the phase difference between the A mode and the B mode, and controls the driving speed of the vibration motor. This phase difference control can increase the driving speed as the phase difference increases. When the phase difference reaches a certain value, control is switched at that timing so that the phase difference at the switching time is maintained constant, the oscillatory frequency is changed, and the driving speed is controlled. This frequency control can increase the driving speed as the oscillatory frequency becomes lower. As described above, this embodiment performs the phase difference control in the low speed range and the frequency control in the high speed range.

The modulated frequency is estimated and the setting oscillatory frequency is shifted only in the phase difference control (or when the driving starts). In the frequency control, the influence on the control due to the low resolution of the oscillatory frequency to be expressed and the setting oscillatory frequency for each control period sequentially change and the intensity of the specific frequency spectrum temporally disperses. Thus, the modulated frequency is not estimated or the setting oscillatory frequency is not shifted with the estimation result.

Although not illustrated in FIG. 7, a directional microphone is provided used for the camera 300 to capture a motion image. In the motion image capturing, the modulated frequency is estimated and the setting oscillatory frequency is shifted so as to prevent the directional microphone from detecting the component of the modulated frequency of the oscillator 100. In the motion image capturing, it is general to restrict a driving speed for each type of driving system in the interchangeable lens 200 so as to restrain an increase of a driving noise and a rapid change of an image plane. This embodiment drives the vibration motor as an actuator configured to drive the focus lens 202 in a phase difference control range in the motion image capturing.

The estimation of the modulated frequency by the estimator 110 is switched by the control state of the vibration motor irrespective of the image capturing state of the camera 300. The estimation of the modified frequency may be set in accordance with the control state of the vibration motor and the image capturing state of the camera 300. For example, in the frequency control state of the vibration motor in the motion image capturing, the prohibited frequency band may be set to a narrow band in accordance with the sensitivity characteristic of the directional microphone so as to widen the usable frequency band and to enhance the control stability.

Figure 8A:
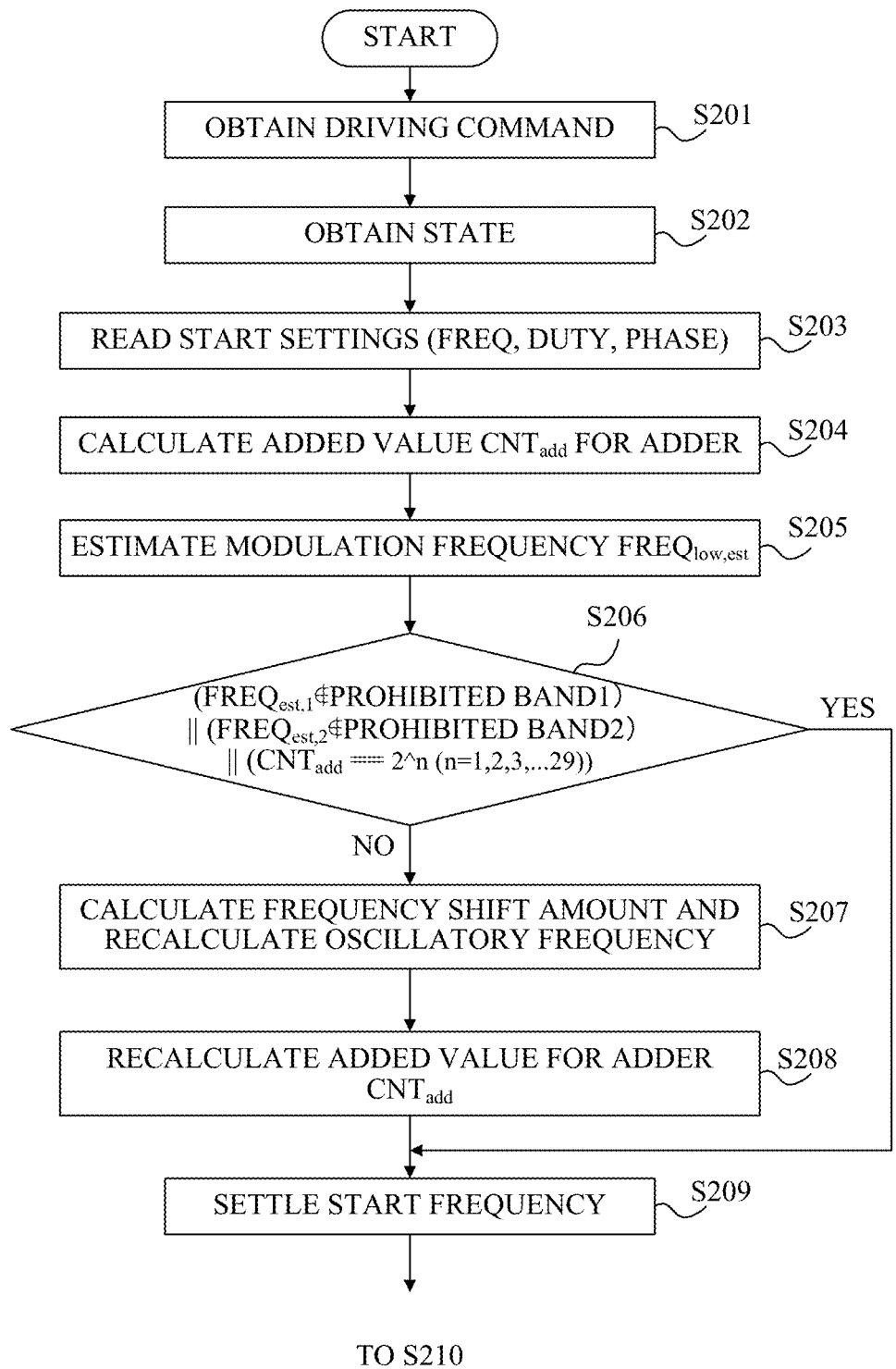
FIGS. 8A and 8B are flowcharts of focus lens driving processes according to the second embodiment.
Figure 8B:
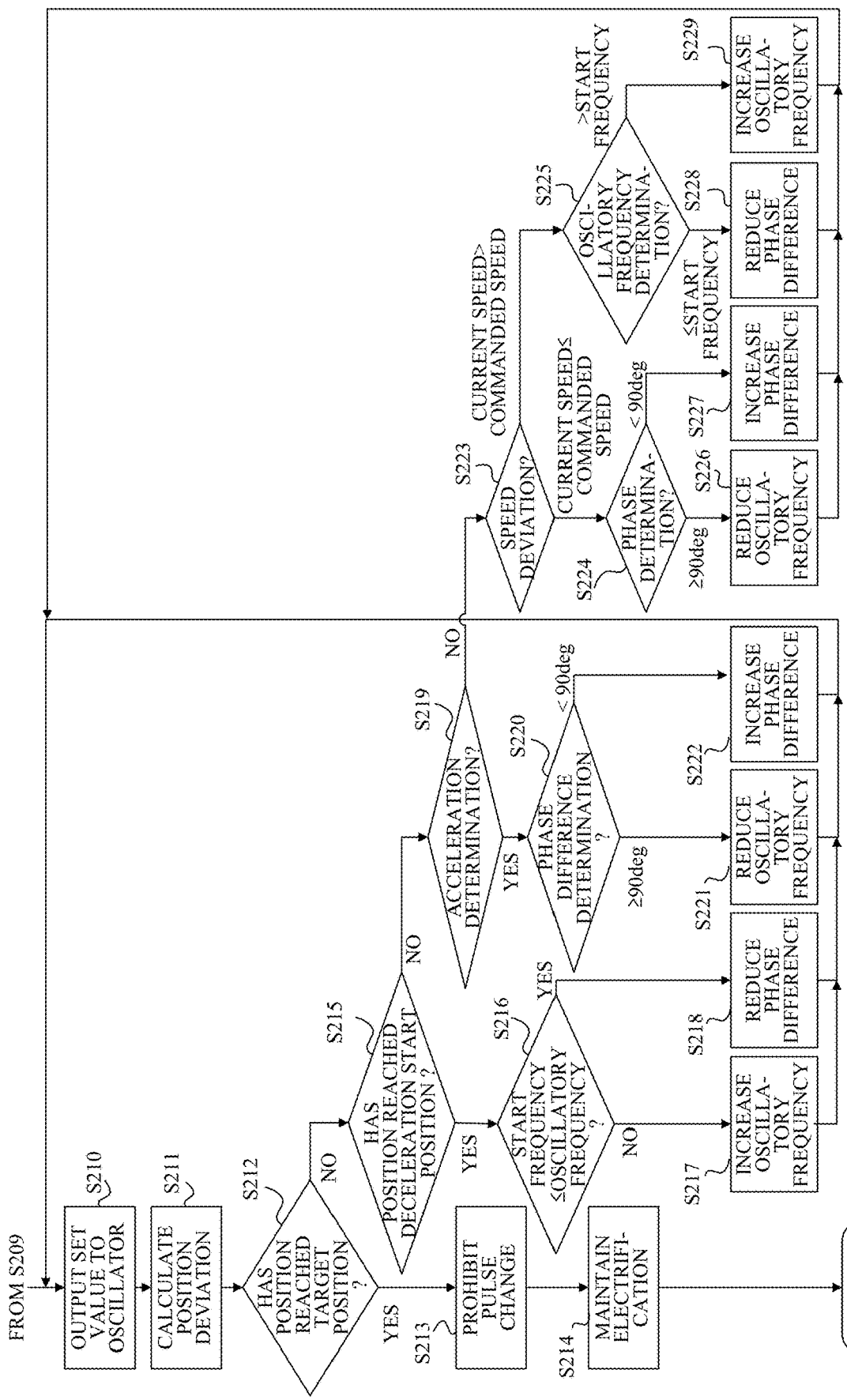

Under the above condition, a description will be given of a process for controlling driving of the vibration motor (or driving of the focus lens 202), with reference to flowcharts in FIGS. 8A and 8B. The lens CPU 201 and the focus controller 203 execute this process in accordance with the focus control program as a computer program. The focus control program contains a frequency control program that performs the frequency shift process for the setting oscillatory frequency.

In the step S201, the lens CPU 201 obtains the focus driving command (referred to as a "camera side focus driving command" hereinafter) sent from the camera CPU 301. The camera CPU 301 obtains the focus state of the image capturing optical system through the focus detection unit 302, and calculates the driving amount and the driving direction of the focus lens 202 based on the focus state. The camera CPU 301 sends the camera side focus driving command containing the driving amount and the driving direction of the focus lens 202, to the lens CPU 201.

The camera side focus driving command contains information indicative of the state of the camera 300, such as setting of the still image/motion image capturing modes, and whether the motion image is being captured). This information is used for the lens CPU 201 to limit the driving speed of the vibration motor.

The focus controller 203 (CPU 120) sets the target position and the designated speed for the focus lens 202 based on the camera side focus driving command received via the lens CPU 201. When the designated speed is below the predetermined value, the vibration motor is driven based only on the phase difference control, and when the designated speed is equal to or above the predetermined value, the vibration motor is driven based on a combination of the phase difference control and the frequency control.

Separate from the camera side focus driving command, the lens CPU 201 outputs, to the focus controller 203, a lens side focus driving command in accordance with an operation of the user of the above manual focus ring provided onto the interchangeable lens 200. The focus controller 203 (CPU 120) sets the target position and the designated speed of the focus lens 202 based on the lens side focus driving command similar to the case where the focus controller 203 receives the lens side focus driving command. The information indicative of the state of the camera 300 may be obtained from the camera CPU 301 at that time, or the previously obtained information may be utilized.

Next, in the step S202, the focus controller 203 (CPU 120) obtains the state of the vibration motor. The vibration motor is subject to the temperature characteristic of the piezoelectric element and a deterioration caused by the abrasion between the oscillating object and the contact member, and the oscillatory frequency characteristic (such as a start oscillatory frequency at the driving start) in the driving may be changed when the driving environment changes. Hence, the CPU 201 that has received the driving process command obtains the temperature information from the unillustrated temperature sensor and the sequentially stored driving number of the vibration motor from the unillustrated memory.

Next, in the step S203, the focus controller 203 (CPU 120) obtains the setting oscillatory frequency FREQ, the set duty ratio DUTY, and the set phase difference PHASE between A and B modes, from the unillustrated memory, and outputs (sets) only the setting oscillatory frequency FREQ to the estimator 110 in the focus controller 203. The focus controller 203 outputs, as the setting oscillatory frequency FREQ, the fine adjusted setting oscillatory frequency stored in the memory in accordance with the temperature information and the driving number information obtained in the step S202.

In the step S204, the focus controller 203 calculates the added value $CNT_{add}$ for each clock period for the adder 101 in the focus driving circuit 204 corresponding to the setting oscillatory frequency FREQ set in the step S203. The added value $CNT_{add}$ can be calculated by the following expression where $CNT_{max}$ is the count upper limit value and CLK is the clock frequency:

$$CNT_{add} = FREQ \times (CNT_{max}+1)/CLK$$

Next, in the step S205, the focus controller 203 (estimator 110) estimates the first and second estimated modulated frequencies $FREQ_{est.1}$ and $FREQ_{est.2}$ when the oscillator 100 in the focus driving circuit 204 outputs the setting oscillatory frequency FREQ. As described above, the estimation modulated frequency $FREQ_{est.1}$ is estimated by converting the absolute value of the difference into the frequency between the surplus value $S_1$ that occurs in the overflow in the first count period and the surplus value $S_2$ that occurs in the overflow in the second count period or by the calculation of $|S_1-S_2| \times CLK/(CNT_{max}+1)$.

The second estimated modulated frequency $FREQ_{est.2}$ can be calculated from an overflow value of the counter that occurs with the first modulated frequency. More specifically, where $\alpha_{dec}$ is a decimal part of the calculation result of $(CNT_{add}/|S_1-S_2|)$, the second estimated modulated frequency $FREQ_{est.2}$ can be estimated using $FREQ/(CNT_{add}/(CNT_{add}-(|S_1-S_2| \times \alpha_{dec})))$.

In the step S206, the focus controller 203 (estimator 110) determines whether the first and second estimated modulated frequencies $FREQ_{est.1}$ and $FREQ_{est.2}$ calculated in the step S205 are located in the prohibited frequency band. As described above, the prohibited frequency band is set to 2 to 12 kHz for the first estimated modulated frequency and 3 to 5 kHz for the second estimated modulated frequency. The determination expression is a logic disjunction between the fact that both the first and second estimated modulated frequencies $FREQ_{est.1}$ and $FREQ_{est.2}$ are located outside of the prohibited frequency band, and the fact that counter added value $CNT_{add}$ is divided by two (or that no modulated frequency occurs). When the determination expression is not satisfied, the modulated frequency occurs in the prohibited frequency band due to the PDM control with the setting oscillatory frequency FREQ set in the step S202, and it is necessary to shift the setting oscillatory frequency. Therefore, the focus controller 203 (estimator 110) moves to the step S207. On the other hand, when the determination expression is satisfied, the flow moves to the step S209.

In the step S207, the focus controller 203 (estimator 110) calculates the shift frequency ΔFREQ from the setting oscillatory frequency FREQ so as to shift both the first and second estimated modulated frequencies to the outside of the prohibited frequency band, and provides the frequency shift process for calculating the post-shift setting oscillatory frequency FREQ'. The second estimate modulated frequency has a nonlinear characteristic for a frequency change unlike the first estimated modulated frequency. Since the first estimated modulated frequency>the second estimated modulated frequency, the shift frequency ΔFREQ is calculated in accordance with the following sequence in consideration of a value range of the prohibited frequency band set in this embodiment.

Figure 9:
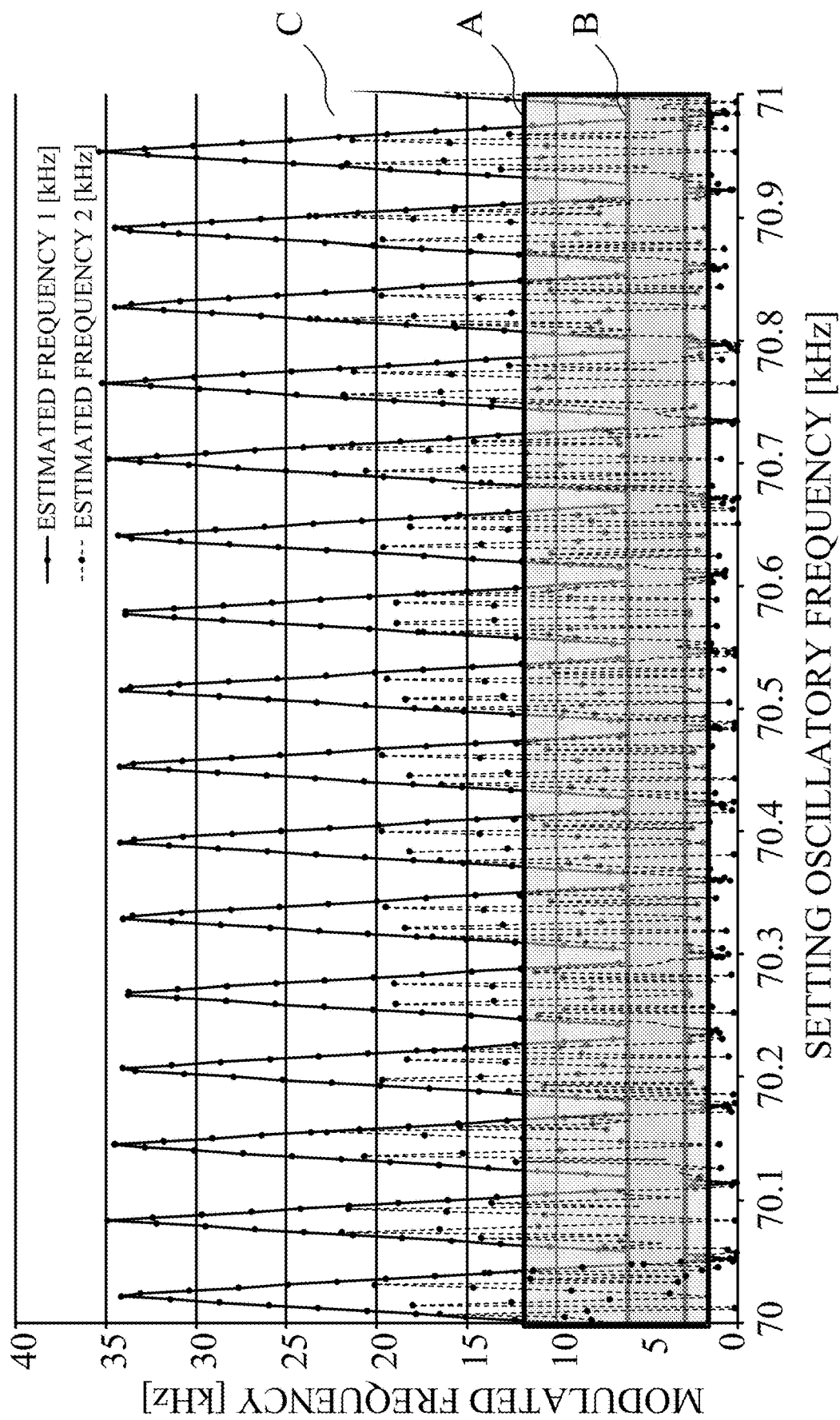
FIG. 9 is a view illustrating a relationship among a setting oscillatory frequency, a first estimated modulated frequency, and a second estimated modulated frequency according to the second embodiment.

FIG. 9 illustrates changes of the first and second estimated modulated frequencies as the setting oscillatory frequency changes in this embodiment. The abscissa axis denotes a setting oscillatory frequency, the ordinate axis denotes a modulated frequency. A ● plot connected by a solid line is the first estimated modulated frequency ("estimated frequency 1" in FIG. 9), and a ● plot connected by a solid line is the second estimated modulated frequency ("estimated frequency 2" in FIG. 9). In FIG. 9, masked belt areas A and B are prohibited frequency bands to the first and second estimated modulated frequencies and the area C is an area in which the first and second estimated modulated frequencies can be located. The shift frequency ΔFREQ is calculated so that the first and second estimated modulated frequencies or the first and second modulated frequencies can be located in the area C.

The estimator 110 calculates the shift frequency ΔFREQ as follows. Initially, the estimator 110 determines which of the first and second estimated modulated frequencies is located in the prohibited frequency band. When the first estimated modulated frequency is located in the prohibited frequency band, the process differs according to the value of the first estimated modulated frequency.

When the first estimated modulated frequency $FREQ_{est.1}$<10 kHz, the estimator 110 shifts the first modulated frequency so that the first modulated frequency is located on the low frequency side of the prohibited frequency band as in the following expression:

$$\Delta FREQ=(FREQ_{est.1}-2\text{ kHz})/Q_1$$

Herein, $Q_1$ is the number of additions up to the overflow in the first count period, and 2 kHz is the lowest frequency in the prohibited frequency band for the first estimated modulated frequency. A sign of ΔFREQ becomes minus when $S_1-S_2$ becomes a negative value, meaning a shift to the low frequency side. The sign of ΔFREQ becomes plus when $S_1-S_2$ becomes a positive value, meaning a shift to the high frequency side. The first estimated modulated frequency is below 2 kHz for the post-shift setting oscillatory frequency FREQ', and the second estimated modulated frequency is lower than the first estimated modulated frequency or lower than 2 kHz. Thus, neither the first nor second estimated modulated frequency is located in the prohibited frequency band.

On the other hand, when the first estimated modulated frequency $FREQ_{est.1}$≥10 kHz, the estimator 110 shifts the first estimated modulated frequency so that the first modulated frequency is located on the high frequency side of the prohibited frequency band as in the following expression:

$$\Delta FREQ=(12\text{ kHz}-FREQ_{est.1})/Q_1$$

12 kHz is the highest frequency ($FRWQ_{spc}$) in the prohibited frequency band for the first estimated modulated frequency. A sign of ΔFREQ becomes plus when $S_1-S_2$ becomes a negative value, meaning a shift to the high frequency side. The sign of ΔFREQ becomes minus when $S_1-S_2$ becomes a positive value, meaning a shift to the low frequency side.

The estimator 110 determines whether the second estimated modulated frequency $FREQ_{est.2}$ is located outside of the prohibited frequency band with the post-shift setting oscillatory frequency FREQ'. Unless the second estimated modulated frequency $FREQ_{est.2}$ is located outside of the prohibited is frequency band, the setting oscillatory frequency is again shifted in the same direction as that of ΔFREQ. By repeating this process a plurality of times, the setting oscillatory frequency FREQ' can be searched in which both the first and second estimated modulated frequencies are located outside of the prohibited frequency band.

When the second estimated modulated frequency is not located outside of the prohibited frequency band, the estimator 110 performs a process equivalent with that for the case where the first estimated modulation frequency $FREQ_{est.1}$≥10 kHz. A shift direction of the setting oscillatory frequency may be a direction in which the current first estimated modulated frequency separates from the prohibited frequency band (12 kHz).

Thus, the post-shift setting oscillatory frequency FREQ' can be calculated in which both the first and second estimated modulated frequencies are located outside of the prohibited frequency band.

Next, in the step S208, the focus controller 203 (estimator 110) calculates the added value $CNT_{add}$ for each clock for the adder 101 corresponding to the post-shift setting oscillatory frequency FREQ' calculated in the step S207. Similar to the step S204, the added value $CNT_{add}$ is calculated as follows where $CNT_{max}$ is the count upper limit value and CLK is the clock:

$$CNT_{add}=FREQ'\times(CNT_{max}+1)/CLK$$

Thereafter, the focus controller 203 moves to the step S209.

In the step S209, the focus controller 203 (CPU 120) settles the post-shift setting oscillatory frequency FREQ' calculated by the estimator 110 as information output to the oscillator 100. When it is determined that the modulated frequency that occurs with the setting oscillatory frequency FREQ in the step S206 is not located in the prohibited frequency band, a relationship of FREQ=FREQ' is established. The setting oscillatory frequency settled in this process becomes a start frequency, and the oscillatory frequency in the phase difference control over the vibration motor.

Next, in the step S210, the focus controller 203 (CPU 120) outputs an output enablement ENABLE to the oscillator 100. Moreover, the CPU 120 outputs the set duty ratio DUTY set in the step S203, the set phase difference PHASE between the A and B modes, and the post-shift setting oscillatory frequency FREQ' settled in the step S209, to the oscillator 100. This process electrifies the vibration motor, and actually starts driving the focus lens 202.

Next, in the step S211, the focus controller 203 (CPU 120) calculates a position deviation between the current position of the focus lens 202 obtained from the focus position detector 150 and the target position set in the step S201.

Next, in the step S212, the focus controller 203 (CPU 120) determines whether the position deviation calculated in the step S211 becomes 0 or the focus lens 202 has reached the target position. The CPU 120 moves to the step S213 when the focus lens 202 has reached the target position, and moves to the step S215 when the focus lens 202 has not yet reach the target position.

In the step S213, the focus controller 203 (CPU 120) maintains the electrification for a predetermined time period after the focus lens 202 reaches the target position. The focus controller 203 sets the phase difference between the A and B modes to 0 while maintaining the electrification, and generates the standing wave in the oscillating object. This electrification maintenance restrains the focus lens 202 from passing the target position due to the inertia and from stopping there.

This embodiment determines that the focus lens 202 reaches the target position by determining that the target position is equal to the current position (or the position deviation is 0). However, it may be determined that the focus lens 202 reaches the target position when the current position of the focus lens 202 falls in a range |target position±x|, and the subsequent electrification maintenance may be a position feedback control so as to zero the fine deviation.

Next, in the step S214, the focus controller 203 (CPU 120) stops maintaining the electrification at the target position, and completes process for the camera side or lens side focus driving command obtained in the step S201. A series of processes ends for driving of the focus lens 202.

In or after the step S215, the focus controller 203 (CPU 120) determines the driving state of the vibration motor (acceleration or deceleration driving or constant speed driving), and controls driving of the vibration motor.

In the step S215, the focus controller 203 (CPU 120) compares a position deviation between the current position of the focus lens 202 and the target position, with a deceleration driving amount up to the stop obtained from the deceleration profile with the current speed. The focus controller 203 determines, based on the comparison result, whether the focus lens 202 has reached the deceleration start position. When the position deviation is equal to or smaller than the deceleration driving amount, the CPU 120 determines that the focus lens 202 has reached the deceleration start position, and moves to the step S216. When the focus lens 202 does not reach the deceleration start position, the flow moves to the step S219.

In the step S216, the focus controller 203 (CPU 120) determines whether the current setting oscillatory frequency is raised up to the start frequency. In this step, the vibration motor is in the deceleration state. In the deceleration state, this embodiment decelerates the vibration motor with a deceleration according to the deceleration profile. The CPU 120 raises the setting oscillatory frequency up to the start frequency in accordance with the deceleration profile when the frequency control is performed just before the vibration motor is decelerated, and performs the phase difference control so as to promote the deceleration process when the setting oscillatory frequency reaches the start frequency. On the other hand, when the phase difference control is performed just before the deceleration, the CPU 120 performs the deceleration process with the phase difference control.

In this step, the CPU 120 confirms whether the setting oscillatory frequency has the same value as the start frequency in the deceleration process, and determines which of the frequency control or the phase difference control is used for the next control. When the setting oscillatory frequency is equal to or higher than the start frequency, the CPU 120 moves to the step S218. When the setting oscillatory frequency is lower than the start frequency, the CPU 120 moves to the step S217.

This embodiment does not set the setting oscillatory frequency to a value higher than the start frequency in the frequency control in the deceleration. In switching to the phase difference control, the setting oscillatory frequency is set to the same value as the start frequency. Thereby, it is guaranteed that the oscillatory frequency that avoids the modulated frequency is set in the phase difference control in the deceleration.

In the step S217, the focus controller 203 (CPU 120) fixes the phase difference between the A and B modes based on the deceleration profile, and changes the setting oscillatory frequency to the high frequency side. The CPU 120 that has performed this process returns to the step S210 and provides a frequency control.

On the other hand, in the step S218, the focus controller 203 (CPU 120) sets (fixes) the oscillatory frequency to the same value as the start frequency based on the deceleration profile, and reduces the phase difference between the A and B modes. The CPU 120 that has performed this process returns to the step S210 and performs a phase difference control.

In the step S219, the focus controller 203 (CPU 120) determines whether the driving state of the vibration motor is in an accelerated state or in a fixed speed state. The acceleration state can be determined when the CPU 120 currently refers to the acceleration profile or when a speed deviation between the current speed and a higher commanded speed (driving speed contained in the driving command) is equal to or higher than the predetermined value. When the driving state is not the acceleration state, the fixed speed state can be determined. The CPU 120 moves to the step S220 in the acceleration state, and moves to the step S223 in the steady state.

In the step S220, the focus controller 203 (CPU 120) determines the current phase difference between the A and B modes. When the phase difference is below 90 degrees, the CPU 120 moves to the step S222 for the phase difference control, and when the phase difference is equal to or above 90 degrees, the CPU 120 moves to the step S221 for the frequency control.

In the step S221, the focus controller 203 (CPU 120) fixes the phase difference between the A and B modes based on the acceleration profile, and changes the setting oscillatory frequency to the low frequency side. The CPU 120 that has performed this process returns to the step S210 for the phase difference control.

In the step S222, the focus controller 203 (CPU 120) sets (fixes) the oscillatory frequency to the same value as the start frequency based on the acceleration profile, and increases the phase difference between the A and B. The CPU 120 that has performed this process returns to the step S210 for the phase difference control.

In the step S223, the focus controller 203 (CPU 120) determines a current speed deviation. After this step, the process for the fixed speed state is performed but the speed feedback control is performed so as to restrain fine speed fluctuations caused by the load fluctuations. The CPU 120 moves to the step S224 for a fine acceleration process when the current speed is lower than the commanded speed, and moves to the step S225 for a fine deceleration process when the current speed is higher than the commanded speed.

In the step S224, the focus controller 203 (CPU 120) determines the current phase difference between the A and B modes. When the phase difference is equal to or above 90 degrees, the CPU 120 moves to the step S226 for the phase difference control by fixing the phase difference, and when the phase difference is below 90 degrees, the CPU 120 moves to the step S227 for the phase difference control.

In the step S226, the focus controller 203 (CPU 120) fixes the phase difference since the phase difference reaches 90 degrees in the just previous control, and changes the oscillatory frequency. For the fine acceleration process, the CPU 120 sets the oscillatory frequency lower than the current oscillatory frequency and drives the vibration motor. The CPU 120 that has performed this process returns to the step S210.

In the step S227, the focus controller 203 (CPU 120) further increases the phase difference and torque of the vibration motor since the phase difference has not yet reached 90 degrees. The CPU 120 that has performed this process returns to the step S210.

In the step S225, the focus controller 203 (CPU 120) estimates the current oscillatory frequency. The CPU 120 moves to the step S228 for the phase difference control when the oscillatory frequency is equal to or below the start frequency, and moves to the step S229 for the frequency control when the oscillatory frequency is higher than the start frequency.

In the step S228, the focus controller 203 (CPU 120) reduces the phase difference and restrains the torque of the vibration motor for the deceleration process. The CPU 120 that has performed this process returns to the step S210.

In the step S229, the focus controller 203 (CPU 120) makes higher the oscillatory frequency and restrains the torque for the vibration motor for the deceleration process. The CPU 120 that has performed this process returns to the step S210.

As described above, this embodiment estimates the first and second modulated frequencies that occur in the PDM control, and shifts the set frequency in accordance with the estimation result. This configuration drives the vibration motor and moves the focus lens 202 without causing the first and second modulated frequencies to be located in the prohibited frequency band.

According to this embodiment, the interchangeable lens 200 estimates the first and second modulated frequencies that occur in the oscillator 100, and shifts the setting oscillatory frequency so that the estimation result can provide that they are located outside of the prohibited frequency band. However the time information may be provided to the information of the estimation result and output to the camera 300, and the camera 300 may remove or reduce, based on the information, the frequency band of the modulated frequency as noises relating to the first and second modulated frequencies from the recorded audio information.

While this embodiment discusses the lens interchangeable type camera system, the frequency shift process described in this embodiment can be performed in driving the vibration motor configured to drive the optical element, such as a lens, in the lens integrated type camera (optical apparatus).

Each of the embodiments can provide a frequency control apparatus configured to estimate an undesired mixed frequency that occurs in the frequency control in the PDM system, and to prevent the mixed frequency from being contained in the specific band. When the frequency control apparatus is installed in the motor driving apparatus or image capturing apparatus, a problem, such as a noise and an uneven speed, can be restrained.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-240719, filed on Dec. 10, 2015 which is hereby incorporated by reference herein in its entirety.

What is claimed is:

1. A frequency control apparatus comprising:
a signal generator configured to generate, by performing a Pulse Density Modulation (PDM) control, an output signal as a digital signal having a target frequency that has been set, using a plurality of signals having frequencies that are different from the target frequency and one another;
an estimator configured to estimate a mixed frequency that is a frequency of a signal component mixed in the output signal and different from the target frequency and each of frequencies of the plurality of signals; and
a frequency shift unit configured to shift at least one of the target frequency and the frequencies of the plurality of signals in accordance with an estimation result of the mixed frequency,
wherein the estimator is configured to determine whether the mixed frequency is included in a specific frequency band, and the frequency shift unit shifts at least one of the target frequency and the frequencies of the plurality of signals, when the estimator has determined that the mixed frequency is included in the specific frequency band.

2. The frequency control apparatus according to claim 1, wherein the specific frequency band is an audible band of a human, and a frequency band lower than the target frequency.

3. The frequency control apparatus according to claim 1, wherein the signal generator generates the output signal by an adder system including:
a counter configured to increase a count value by each added value at a predetermined period from a count lower limit value to a count upper limit value; and
a comparator configured to switch high and low states of the output signal in accordance with whether the count value is larger or smaller than a predetermined value between the lower limit value and the count upper limit value.

4. The frequency control apparatus according to claim 3, wherein the estimator estimates a low range frequency lower than at least one of a plurality of mixed frequencies using a calculation using the count upper limit value and the added value.

5. The frequency control apparatus according to claim 1, wherein the estimator estimates a low range frequency lower than at least one of the plurality of mixed frequencies, and
wherein the frequency shift unit shifts the frequency of at least one of the plurality of signals when the low range frequency is contained in the specific frequency band, and calculates a shift amount of the frequency of at least one of the plurality of signals using the low range frequency and a maximum frequency of the specific frequency band.

6. A non-transitory computer-readable storage medium configured to store a program for controlling a frequency control apparatus configured to generate, by performing a Pulse Density Modulation (PDM) control, an output signal as a digital signal having a target frequency that has been set, using a plurality of signals having frequencies that are different from the target frequency and one another, the program enabling a computer to execute a method including the steps of:

estimating a mixed frequency that is a frequency of a signal component mixed in the output signal and different from the target frequency and each of frequencies of the plurality of signals;

determining whether the mixed frequency is included in a specific frequency band; and shifting at least one of the target frequency and the frequencies of the plurality of signals in accordance with an estimation result of the mixed frequency when the estimator has determined that the mixed frequency is included in the specific frequency band.

7. A frequency control apparatus comprising:

a signal generator configured to generate an output signal as a digital signal having a target frequency that has been set, using a plurality of signals having frequencies that are different from the target frequency and one another;

an estimator configured to estimate a mixed frequency that is a frequency of a signal component mixed in the output signal and different from the target frequency and each of frequencies of the plurality of signals; and a frequency shift unit configured to shift at least one of the target frequency and the frequencies of the plurality of signals, when the mixed frequency that has been estimated by the estimator is included in a specific frequency band;

wherein the specific frequency band is an audible band of a human, and a frequency band lower than the target frequency.

8. A frequency control apparatus comprising:

a signal generator configured to generate an output signal as a digital signal having a target frequency that has been set, using a plurality of signals having frequencies that are different from the target frequency and one another;

an estimator configured to estimate a mixed frequency that is a frequency of a signal component mixed in the output signal and different from the target frequency and each of frequencies of the plurality of signals; and a frequency shift unit configured to shift at least one of the target frequency and the frequencies of the plurality of signals in accordance with an estimation result of the mixed frequency;

wherein the signal generator generates the output signal by an adder system including:

a counter configured to increase a count value by each added value at a predetermined period from a count lower limit value to a count upper limit value; and a comparator configured to switch high and low states of the output signal in accordance with whether the count value is larger or smaller than a predetermined value between the lower limit value and the count upper limit value.

* * * * *